(12) United States Patent
Melchor Saucedo

(10) Patent No.: US 9,397,485 B2
(45) Date of Patent: Jul. 19, 2016

(54) ELECTRICAL DISTRIBUTION CENTER

(71) Applicant: DELPHI TECHNOLOGIES, INC., Troy, MI (US)

(72) Inventor: Gustavo Eric Melchor Saucedo, Chihuahua (MX)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 14/533,500

(22) Filed: Nov. 5, 2014

(65) Prior Publication Data

US 2016/0126706 A1    May 5, 2016

(51) Int. Cl.
| | |
|---|---|
| *H01R 9/22* | (2006.01) |
| *H05K 7/06* | (2006.01) |
| *H02B 1/48* | (2006.01) |
| *H02B 1/18* | (2006.01) |
| *H05K 5/00* | (2006.01) |

(52) U.S. Cl.
CPC .. *H02B 1/48* (2013.01); *H02B 1/18* (2013.01); *H05K 5/0026* (2013.01); *H05K 5/0069* (2013.01)

(58) Field of Classification Search
None
See application file for complete search history.

(56) References Cited

U.S. PATENT DOCUMENTS

| | | | |
|---|---|---|---|
| 6,108,202 A | 8/2000 | Sumida | |
| 6,315,578 B1 * | 11/2001 | Kasai | H01R 9/2458 439/404 |
| 6,431,880 B1 * | 8/2002 | Davis | H01R 9/2491 439/76.2 |
| 6,796,808 B2 * | 9/2004 | Hosoe | H01R 9/226 361/826 |
| 7,878,822 B2 * | 2/2011 | Korczynski | B60R 16/0238 220/326 |
| 7,955,133 B2 | 6/2011 | Scheele et al. | |
| 8,207,626 B1 | 6/2012 | Groves | |
| 8,416,575 B2 * | 4/2013 | Sato | H01R 9/226 174/260 |
| 8,913,371 B2 * | 12/2014 | Depp | H01H 50/021 361/626 |
| 2003/0147221 A1 * | 8/2003 | Blasko | H05K 1/0263 361/736 |
| 2004/0007379 A1 * | 1/2004 | Suzuki | B60R 16/0239 174/59 |
| 2007/0270045 A1 * | 11/2007 | Korczynski | B60R 16/0238 439/723 |
| 2008/0225545 A1 | 9/2008 | Seidler | |
| 2014/0049101 A1 | 2/2014 | Snider et al. | |
| 2014/0211379 A1 | 7/2014 | Borowicz et al. | |

* cited by examiner

*Primary Examiner* — Courtney Smith
(74) *Attorney, Agent, or Firm* — Robert J. Myers

(57) ABSTRACT

An electrical distribution center, such as those used in a motor vehicle to provide and manage electrical power from a battery to electrical modules such as headlights, taillights, wiper motors, etc. is presented herein. The electrical distribution center includes a housing containing electrical switching devices, such as relays to control the flow of electrical power. The housing also contains fuses to protect various circuits connected to the electrical distribution center. The fuses are arranged on the exterior walls of the housing and are accessible for service and replacement without requiring a cover to be removed to access an internal cavity containing the relays. There are no fuses within the internal cavity of the electrical distribution center. The electrical distribution center is connected to a number of wiring harnesses via electrical connectors terminating the wiring harnesses and interconnecting the electrical distribution center to the power supply and electrical modules.

10 Claims, 3 Drawing Sheets

ELECTRICAL DISTRIBUTION CENTER

TECHNICAL FIELD OF THE INVENTION

The invention relates to an electrical distribution center, particularly an electrical distribution center configured for use in a motor vehicle having fusible link devices that are accessible externally to the electrical distribution center.

BACKGROUND OF THE INVENTION

Electrical distribution centers, such as those used in a motor vehicle, provide and manage electrical power from a common power source, e.g. a battery, to the many electrical components, e.g. lights, motors, instruments, that are electrically connected to the electrical distribution center generally. Electrical distribution centers provide a centralized location for electronic components including relays, fuses, and the like. According to an electrical distribution center illustrated in FIG. 1, the electrical components, both the relays 12 and the fuses 14, are contained within an internal cavity 16 inside a housing 18 of the electrical distribution center, generally designated by the reference number 10. The electrical distribution center 10 also includes a cover (not shown) configured to enclose the internal cavity 16. As the electrical content of motor vehicle has increased, a corresponding increase in the number of electronic devices in the electrical distribution center has occurred. However, the allotted volume of packaging space in the vehicle for the electrical distribution center may not have similarly increased. In addition, it remains desirable to have accessibility to the electronic components if service to these removable components is required. Therefore, an electrical distribution center that can accommodate an increased number of electronic components in a decreased volume while still providing access to these electronic components for servicing is desired.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In accordance with an embodiment of the invention, an electrical distribution center, such as those used in a motor vehicle, is provided. The electrical distribution center includes a plurality of electrical switching devices, and a printed circuit board (PCB) having two opposed major surfaces and four opposed minor surfaces. The plurality of electrical switching devices are mechanically and electrically coupled to the printed circuit board. The electrical distribution center further includes a plurality of fusible link devices and a plurality of L-shaped terminals formed of a conductive material connecting the plurality of fusible link devices to the printed circuit board. A first portion of the plurality of L shaped terminals connected to the circuit board is perpendicular to the two opposed major surfaces and a second portion of the plurality of L-shaped terminals connected to the plurality of fusible link devices is parallel to the two opposed major surfaces. The electrical distribution center additionally includes a housing that is formed of a dielectric material and generally has an open box shape comprising a floor, two opposing side walls and two opposing end walls. The floor, side walls, and end walls define an internal cavity within the housing. The printed circuit board is disposed within this cavity. At least one side wall or end wall defines a plurality of apertures in which the plurality of fusible link devices are received.

The electrical distribution center may be configured so that all of the plurality of fusible link devises are accessible from the apertures in the side or end walls and there are no fusible link devices disposed within the internal cavity of the housing.

A first portion of the plurality of fusible link devices may be cartridge style fuses having female socket terminals while a second portion of the plurality of fusible link devices have male blade terminals.

The plurality of apertures configured to receive the plurality of fusible link devices may be defined by the two side walls. The two side walls may be configured to be separable from the housing.

The electrical distribution center further includes a cover that is removably attached to the housing and is configured to enclose said internal cavity.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

An electrical distribution center, such as those used in a motor vehicle to provide and manage electrical power from a battery to the many electrical modules, such as headlights, taillights, wiper motors is presented herein. The electrical distribution center includes a housing containing electrical switching devices to control the flow of electrical power, such as electromechanical relays, solid state relays, or the like, hereinafter generically referred to as relays. The housing also contains fusible link devices, hereinafter referred to as fuses. The fuses are arranged on the exterior walls of the housing and are accessible for service and replacement without requiring a cover to be removed to access an internal cavity containing the relays. There are no fuses within the internal cavity. The electrical distribution center is connected to a number of wiring harnesses via electrical connectors terminating the wiring harnesses and interconnecting the electrical distribution center to the power supply and electrical modules.

Figure 2:
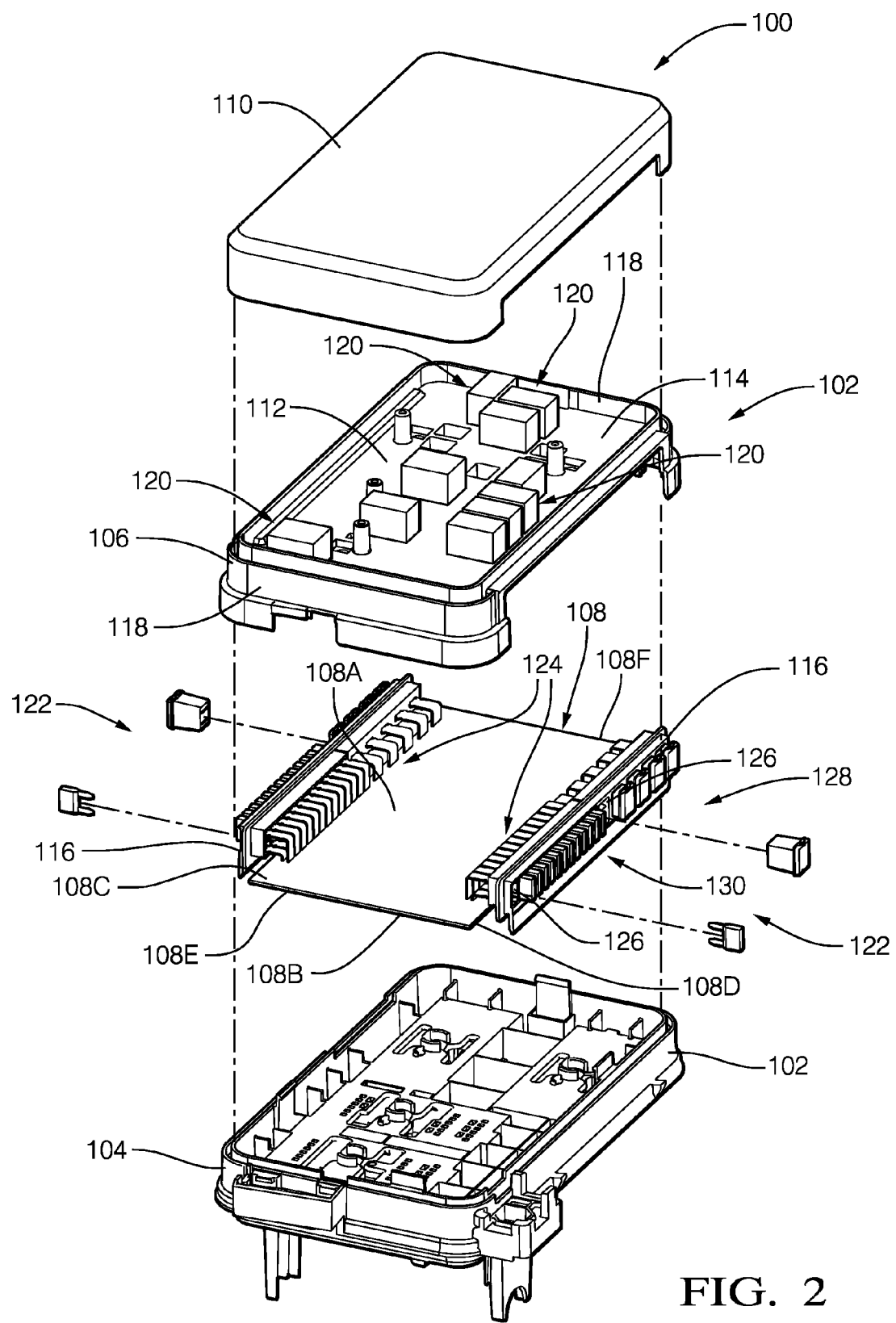
FIG. 2 is an exploded perspective view of an electrical distribution center according to one embodiment.

FIG. 2 illustrates a non-limiting example of an electrical distribution center, generally referred to be the reference number 100. The electrical distribution center 100 includes a housing, generally referred to be the reference number 102 that is formed of a dielectric material, for example polybutylene terephthalate (PBT), polyamide (PA, NYLON), glass-filled polymer, or any other known dielectric material capable of meeting the performance requirements of the housing 102. The housing 102 includes three major components, a lower housing 104 that is configured to interface with and attach to the electrical connectors (not shown) of the wiring harnesses (not shown), a generally box shaped upper housing 106 that contains a printed circuit board 108 and a removable cover 110 that encloses an internal cavity 112 within the upper housing 106 defined by the floor 114, side walls 116, and end walls 118 of the upper housing 106.

The printed circuit board 108, hereinafter referred to be the commonly used acronym PCB, may be made from epoxy or polyimide resins. The resin may be reinforced with a woven glass cloth or other matrix such as chopped fibers. PCBs formed of such materials are typically called FR-4 or G-10 type circuit boards. The PCB 108 may alternately be constructed of ceramic or rigid polymers. This listing of acceptable circuit board materials is not exhaustive and other materials may also be used successfully. The materials and manufacturing techniques used to form printed circuit boards are well known to those skilled in the art. The PCB 108 is generally received between the upper and lower housings 104, 106. The PCB 108 is electrically coupled to relays 120 and fuses 122 by conductive terminals 124 attached to the PCB 108. The relays 120 and the fuses 122 are interconnected to one another by conductive traces (not shown) on the surfaces of the PCB 108. The PCB 108 has two opposed major surfaces 108A-B, and four opposed minor surfaces 108 C-F. The PCB 108 includes different types of conductive terminals 124 protruding from the PCB 108 that are configured to interconnect the PCB 108 with the relays 120, the fuses 122, and the electrical connectors (not shown). The terminals (not shown) configured to interface with the electrical connectors are accessible though apertures defined in the lower housing 104. The terminals 124 configured to connect to the relays 120 are accessible through apertures defined in the floor 114 of the upper housing 106. According to the example illustrated in FIG. 2, the terminals 124 configured to receive the fuses 122 are accessible through apertures 126 defined in the side walls 116 of the upper housing 106. The two side walls 116 are configured to be separable from the upper housing 106. Alternative embodiments may be envisioned in which these terminals 124 may instead, or in addition, be accessible though apertures defined in the end walls 118 of the upper housing 106.

The relays 120 and other electronic components such as diodes, resistors, capacitors, or electronic controllers (not shown) are disposed within the internal cavity 112 of the upper housing 106. An electronic controller may control at least some of the relays 120 in the electrical distribution center 100. The electronic controller may include a microprocessor, application specific integrated circuit (ASIC), or may be built from discrete logic and timing circuits. Software instructions that program the electronic controller to control the relays 120 may be stored in a non-volatile memory device (not shown). The memory device may be contained within the microprocessor or ASIC or it may be a separate device. Non-limiting examples of the types of NV memory that may be used include electrically erasable programmable read only memory (EEPROM), masked read only memory (ROM) and flash memory. The electronic controller may also include analog to digital (A/D) convertor circuits and digital to analog (D/A) convertor circuits (not shown) to allow the electronic controller to establish electrical communication with other electronic devices, such as sensors.

The electrical distribution center 100 is configured so that all of the fuses 122 are externally accessible from the apertures 126 in the side walls 116 and/or end walls 118. No fuses are disposed within the internal cavity 112 of the upper housing 106.

The electrical distribution center 100 includes several fuse types. A first portion 128 of the fuses 122 are cartridge style fuses having female socket terminals, such as JCASE™ series fuses manufactured by Littlefuse, Inc. of Chicago, Ill. A second portion 130 of the fuses 122 have male blade terminals, such as MINI 32V series, ATO SILVER series, or MAXI 32V series fuses also manufactured by Littlefuse, Inc. Alternative embodiments may be envisioned wherein all of the fuses 122 have female socket terminals or all of the fuses 122 have male blade terminals.

Figure 3:
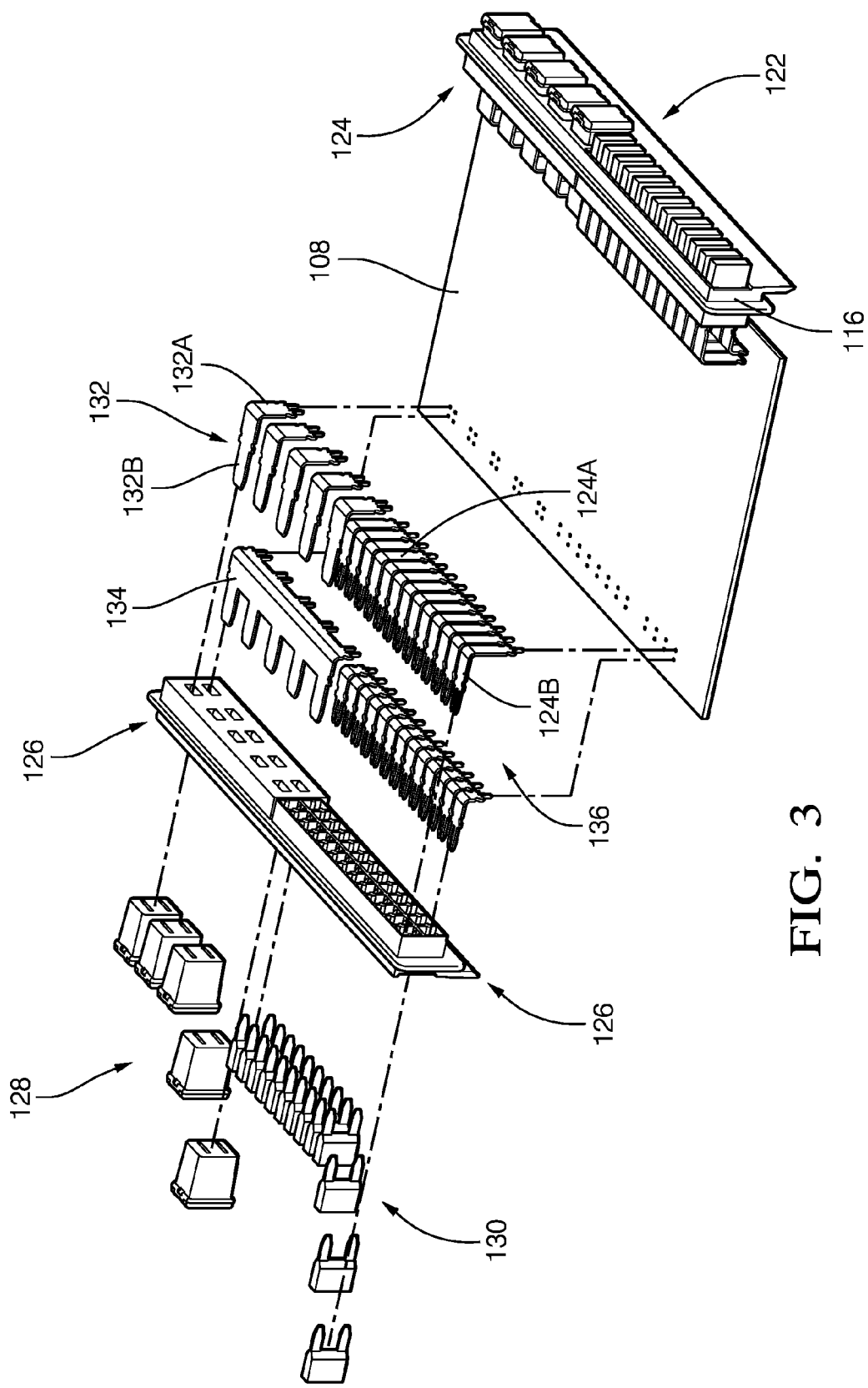
FIG. 3 is an exploded isolated view of terminals connecting fuses to a printed circuit board of the electrical distribution center of FIG. 2 according to one embodiment.

As best shown in FIG. 3, the electrical distribution center 100 includes a number of L-shaped terminals, generally designated by reference number 124, that are formed of a conductive material, such as copper or a copper alloy. These L-shaped terminals 124 connect the fuses 122 to the PCB 108. The L-shaped terminals 132 configured to connect the first portion 128 of fuses 122 to the PCB 108 have male blade type ends that are received by the sockets of the cartridge style fuses. First portions of the plurality of L-shaped terminals 124A, 132A connected to the circuit board are perpendicular to the two opposed major surfaces and second portions of the plurality of L-shaped terminals 124B, 132B connected to the plurality of fusible link devices are parallel to the two opposed major surfaces. A portion of these L-shaped terminals 132 share a common voltage and are interconnected in a single terminal array assembly 134. The L-shaped terminals 136 configured to connect the second portion 130 of fuses 122 to the PCB 108 have forked ends that are configured to receive the male blade terminals of the second portion 130 of the fuses 122. Although the L-shaped terminals 136 shown in FIG. 2 are all individual terminals, other embodiments may be envisioned in which the terminals that share a common voltage are interconnected in a single terminal array assembly.

Figure 1:
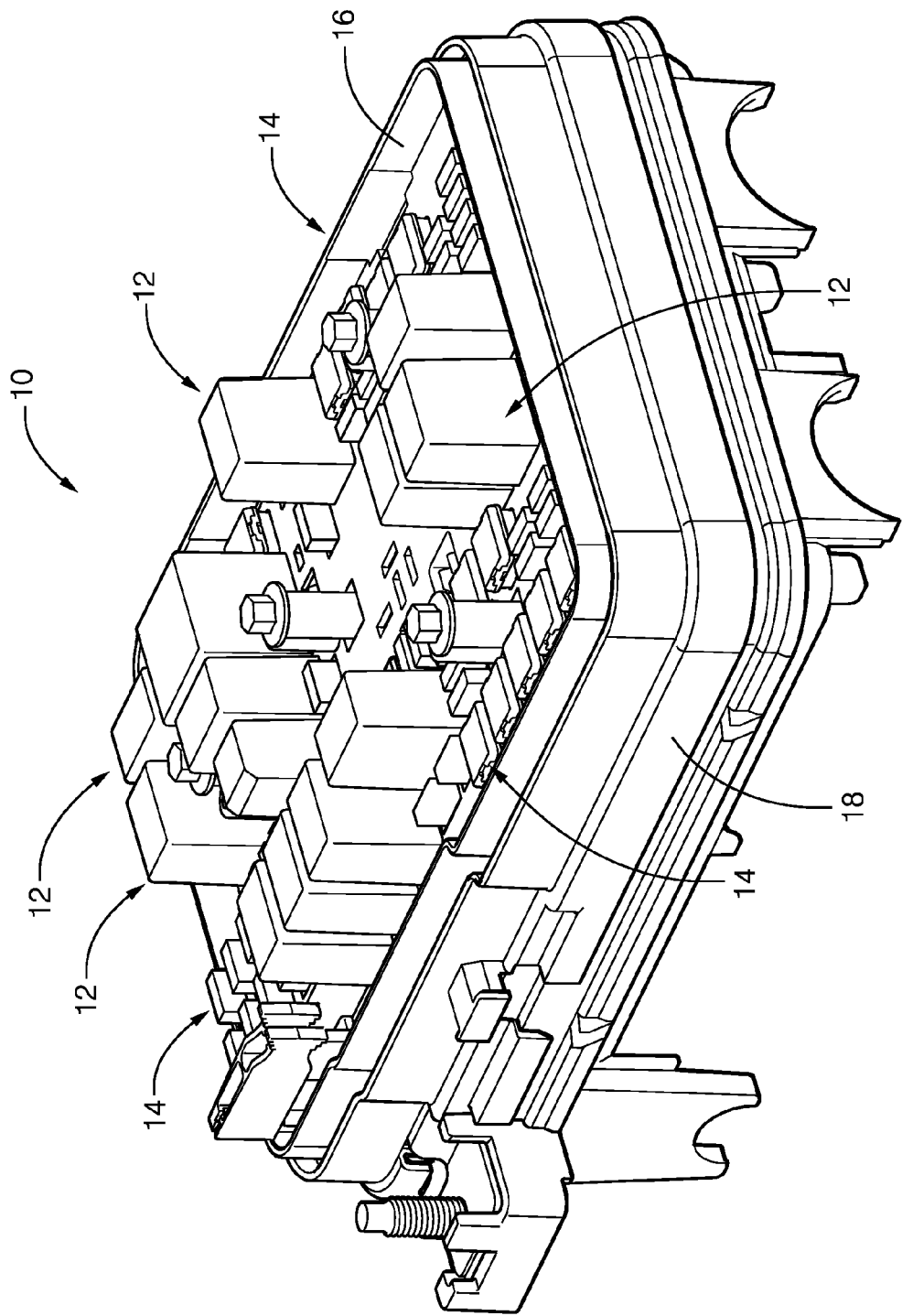
FIG. 1 is a perspective view of an electrical distribution center according to the prior art.

The inventor has found that an electrical distribution center 100 designed to embody the invention may have a volume up to thirty percent smaller than an equivalent electrical distribution center 10 designed according to the prior art, i.e. having the same number of relays 12 and fuses 14 wherein both relays 12 and fuses 14 are contained within an internal cavity 16 of the housing 18 as shown in FIG. 1. The electrical distribution center 100 provides both the benefit of reduced packaging space for the electrical distribution center 100 required within a vehicle and the benefit of reduced material cost to form the housing 102 and PCB 108 due to the decreased volume. The electrical distribution center 100 further provides the benefit of having fuses 122 that are assessable for servicing and replacement without the need to remove the cover 110 or otherwise partially disassemble the electrical distribution center 100.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

I claim:

1. An electrical distribution center, comprising:
   a plurality of electrical switching devices;
   a printed circuit board having two opposed major surfaces and four opposed minor surfaces, wherein the plurality of electrical switching devices are mechanically and electrically coupled to the printed circuit board;
   a plurality of fusible link devices;

a plurality of L-shaped terminals formed of a conductive material connecting the plurality of fusible link devices to the printed circuit board, wherein a first portion of the plurality of L-shaped terminals connected to the circuit board is perpendicular to the two opposed major surfaces and wherein a second portion of the plurality of L-shaped terminals connected to the plurality of fusible link devices is parallel to the two opposed major surfaces; and a housing formed of a dielectric material and generally having an open box shape comprising a floor, two opposing side walls and two opposing end walls, wherein said floor, said side walls and said end walls define an internal cavity, wherein the printed circuit board is disposed within said cavity, and wherein at least one side wall or end wall defines a plurality of apertures in which the plurality of fusible link devices are received.

2. The electrical distribution center according to claim 1, wherein there are no fusible link devices disposed within said internal cavity of the housing.

3. The electrical distribution center according to claim 1, wherein a first portion of the plurality of fusible link devices are cartridge style fuses having female socket terminals.

4. The electrical distribution center according to claim 3, wherein a second portion of the plurality of fusible link devices have male blade terminals.

5. The electrical distribution center according to claim 1, wherein a portion of the plurality of L-shaped terminals is interconnected in a single terminal array assembly.

6. The electrical distribution center according to claim 1, wherein the at least two side walls defines the plurality of apertures in which the plurality of fusible link devices are received.

7. The electrical distribution center according to claim 1, wherein the two side walls are separable from the housing.

8. The electrical distribution center according to claim 1, further comprising a cover removably attached to said housing and configured to enclose said internal cavity.

9. The electrical distribution center according to claim 1, wherein the electrical distribution center is installed in a motor vehicle.

10. The electrical distribution center according to claim 1, wherein the floor is parallel to the two major surfaces of the printed circuit board and wherein the two opposing side walls and the two opposing end walls are perpendicular to the two major surfaces of the printed circuit board.

* * * * *